(12) United States Patent
Kojima et al.

(10) Patent No.: US 7,659,047 B2
(45) Date of Patent: Feb. 9, 2010

(54) MATERIALS FOR PHOTORESIST, NEGATIVE-TONE PHOTORESIST COMPOSITION, METHOD OF FORMING RESIST PATTERN, AND SEMICONDUCTOR DEVICE

(75) Inventors: Kyoko Kojima, Kunitachi (JP); Takashi Hattori, Musashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/607,031

(22) Filed: Dec. 1, 2006

(65) Prior Publication Data
US 2007/0128541 A1   Jun. 7, 2007

(30) Foreign Application Priority Data
Dec. 2, 2005   (JP)   .............. 2005-348781

(51) Int. Cl.
G03F 7/00   (2006.01)
G03F 7/004   (2006.01)
C07C 39/04   (2006.01)

(52) U.S. Cl. .............. 430/270.1; 430/322; 568/720

(58) Field of Classification Search .......... 430/270.1, 430/326, 905, 322; 568/720
See application file for complete search history.

(56) References Cited

U.S. PATENT DOCUMENTS

| 6,673,512 B1 * | 1/2004 | Uenishi et al. ........... 430/270.1 |
| 2003/0134232 A1 * | 7/2003 | Yokoyama et al. ........ 430/312 |
| 2006/0105273 A1 * | 5/2006 | Fukuda et al. .............. 430/313 |
| 2008/0081281 A1 * | 4/2008 | Kojima et al. ............ 430/270.1 |

FOREIGN PATENT DOCUMENTS

| JP | 2003-195502 | 7/2003 |
| JP | 2003-202672 | 7/2003 |
| JP | 2005-266741 | * 9/2005 |
| WO | WO 2004/012012 A1 | 2/2004 |

OTHER PUBLICATIONS

Hirayama, T., Shiono, D., Matsumaru, S., Ogata, T., Hada, H., Onodera, J., Arai, T., Sakamizu, T., Yamaguchi, A., Shirashi, H., Fukuda, H., Ueda, M.- "Depth Profile and Line-Edge Roughness of Low-Molecular-Weight Amorphous Electron Beam Resists", The Japan Society of Applied Physiscs, vol. 44, No. 7B, 2005, pp. 5484-5488.*

Yokoyama, Y., Hattori, T., Kimura, K., Tanaka, T., Shiraishi, H.- "Design of Novel ArF Negative Resist System for Phase-Shifting Lithography Using Androsterone Structure with gamma-Hydroxy Acid", Journal of Polymer Science and technology, vol. 13, No. 4 (2000), pp. 579-588.*

Y. Ochiai, et al. "High-Resolutuin, High-Purity Calix[n]arene Electron Beam resist" Journal of Photopolymer Science and Technology, vol. 13, No. 3, p. 413, 2000.

M. Narihiro, et al. "10-nm-Scale Pattern Delineation Using Calixarene Electron Beam Resist for Complementary Metal Oxide Semiconductor Gate Etching" Japanese journal of Applied Physics, vol. 44, No. 7B, p. 5581, 2005.

* cited by examiner

*Primary Examiner*—Cynthia H Kelly
*Assistant Examiner*—Anca Eoff
(74) *Attorney, Agent, or Firm*—Antonelli, Terry, Stout & Kraus, LLP.

(57) ABSTRACT

With the tendency of reducing the size of semiconductor circuit patterns, edge roughness on a resist pattern is increased when pattern dimensions required are close to the size of the resist molecules. Provided is a technique for preventing degradation of the device performance and negative effects over the system performance caused by the phenomena. A photoresist compound is used, which is a molecule having functional groups that are chemically converted due to an action of an acid with reduced solubility in alkaline developer.

11 Claims, 17 Drawing Sheets

FIG.5

| No. | POLYPHENOL | PHOTORESIST COMPOUND | SENSITIVITY ($\mu C/cm^2$) | RESOLUTION (nm) | LER (nm) |
|---|---|---|---|---|---|
| 1 | 26X-MBSA | A11 | 18 | 40 | 3.0 |
| 2 | 3M6C-MBOC | A12 | 31 | 40 | 3.1 |
| 3 | CyRS-DCA4 | A13 | 30 | 40 | 3.3 |
| 4 | BisPC-BOCHPZ | A14 | 32 | 40 | 3.2 |
| 5 | 3M6C-CIA | A15 | 25 | 40 | 3.0 |
| 6 | OCHP-S | A16 | 30 | 40 | 3.5 |
| 7 | TekPC-BPF | A17 | 24 | 40 | 3.4 |
| 8 | TekPC-BPA | A18 | 30 | 40 | 3.3 |
| 9 | 26X-E | A19 | 27 | 40 | 3.4 |
| 10 | 26X-TPA | A20 | 28 | 40 | 3.3 |
| 11 | OC-HBPA | A21 | 31 | 40 | 3.3 |
| 12 | OCHP-PA | A22 | 32 | 40 | 3.2 |
| 13 | 3M6C-2 | A23 | 30 | 40 | 3.2 |
| 14 | 3M6C-3 | A24 | 30 | 40 | 3.3 |
| 15 | 19-1 | A25 | 18 | 40 | 3.4 |
| 16 | 19-2 | A26 | 15 | 40 | 3.1 |
| 17 | 19-3 | A27 | 15 | 40 | 3.1 |

CHEMICAL FORMULA 7

3M6C-MBSA

CHEMICAL FORMULA 7

25X-MBSA

CHEMICAL FORMULA 7

26X-MBSA

CHEMICAL FORMULA 8

3M6C-MBOC

CHEMICAL FORMULA 8

CyRS-DCA4
R=C9H19

CHEMICAL FORMULA 8

Bispc-BOCHPZ

CHEMICAL FORMULA 8

3M6C-ClA

CHEMICAL FORMULA 8

OCHP-S

CHEMICAL FORMULA 8

30159

TekPC-BPF

CHEMICAL FORMULA 8

TekPC-BPA

CHEMICAL FORMULA 8

26X-E

CHEMICAL FORMULA 8

26X-TPA

CHEMICAL FORMULA 8

OC-HBPA

CHEMICAL FORMULA 8

OCHP-PA

CHEMICAL FORMULA 8

3M6C-2

CHEMICAL FORMULA 8

3M6C-3

CHEMICAL FORMULA 9

..... (31)

CHEMICAL FORMULA 9

..... (32)

CHEMICAL FORMULA 9

..... (33)

CHEMICAL FORMULA 9

..... (34)

CHEMICAL FORMULA 9

····· (35)

CHEMICAL FORMULA 9

····· (36)

CHEMICAL FORMULA 9

····· (37)

CHEMICAL FORMULA 19-1

CHEMICAL FORMULA 19-2

CHEMICAL FORMULA 19-3

PHOTO ACID GENERATOR

PAG-1

PAG-2

PAG-3

PAG-4

PAG-5

PAG-6

PAG-7

PAG-8

PAG-9

PAG-10

PAG-11

PAG-12

PHOTO ACID GENERATOR

PAG-11

PAG-12

PAG-13

PAG-14

PAG-15

PAG-16

PAG-17

PAG-18

PAG-19

PAG-20

PAG-21

PAG-22

PAG-20

PAG-21

PAG-22

PAG-23

MATERIALS FOR PHOTORESIST, NEGATIVE-TONE PHOTORESIST COMPOSITION, METHOD OF FORMING RESIST PATTERN, AND SEMICONDUCTOR DEVICE

CLAIM OF PRIORITY

The present application claims priority from Japanese Application JP 2005-348781, filed on Dec. 2, 2005, the content of which is hereby incorporated by reference into this application.

BACKGROUND OF THE INVENTION

1. Field of the Invention

The present invention relates to a negative-tone resist composition used in microfabrication of a semiconductor device with an electron beam or extreme ultraviolet (EUV) ray, a photoresist compound used for the negative tone resist composition, and, a semiconductor device manufactured by using the negative-tone resist composition.

2. Description of the Related Art

Conventionally, microfabrication by lithography using a photoresist has been performed in a semiconductor manufacturing process. In association with the recent tendency for a higher degree of circuit integration, fine patterns are formed with the size less than 100 nanometers. The wavelength of a beam used for exposure has been decreased from that of a KrF excimer later beam (with a wavelength of 248 nm) to that of an ArF excimer laser beam (with a wavelength of 193 nm), and now the combination of the immersion exposure technique with ArF enables fabrication of 100 nanometers or less. To realize microfabrication of 50 nanometers or less, the lithography technique using the extreme-ultraviolet (EUV) rays (with a wavelength of 13.5 nm) or electron beams are now under development. Now it is required to form various fine patterns including a hole pattern, an isolated line pattern, or a line-and-space, and therefore both positive-tone and negative-tone resist materials are required.

Another important factor is fabrication accuracy in addition to fabrication dimensions. The fabrication accuracy is determined based on the value of line edge roughness. Non-uniformity in pattern dimensions gives influences to performance of semiconductors.

As the negative-tone resist material, the negative-tone resist for Arf described in Japanese Patent Laid-Open Publication NO. 2003-195502 (Patent Document 1) is known. This resist has a hydrophilic γ-hydroxycarboxylic acid structure in a polymer side chain of the acrylic structure. In the exposed portion, esterification occurs in the γ-hydroxycarboxylic acid molecule due to an effect of an acid generated from a photo acid generator, and the hydrophilic characteristic is changed to the hydrophobic one. Therefore, after development using an alkaline developer, the exposed portion becomes insoluble, and a negative-tone pattern is generated.

On the other hand, recently there are also research activities aiming at forming finer patterns using resist based on low-molecular-weight compounds with the size of 1 to 2 nanometers, instead of using polymers with the size of several nanometers or more. A cross-linking type negative-tone resist using calixarene has been reported in Journal of Photopolymer Science and Technology, 2000, 13, p. 413 (Non-Patent Document 1) and Japanese Journal of Applied Physics, 2005, 44, 7B, p. 5581 (Non-Patent Document 2). WO 2004/012012 Publication (Patent Document 2) describes a resist containing a non-polymer molecule as a main component. The resist described in Patent Document 2 provides high resolution and low LER and has four or more reactive sites per molecule, the reactive site being a polarity change reaction moiety.

SUMMARY OF THE INVENTION

When a conventional polymer-based resist material is used, roughness with several nanometers or more appear on the side wall of the pattern, corresponding to the size of the polymer. The roughness is referred to as LER.

In recent years, with the need of reducing the fabrication size, the LER becomes relatively more significant. Thus, it becomes difficult to achieve required fabrication accuracy. For example, in the generation of hp45, the gate length is 20 nanometers or below, and it is required to maintain the roughness within 10% of the fabrication dimensions with respect to the fabrication accuracy. It is difficult to realize the microfabrication as described above since the polymer-based resist material described in Patent Document 1 include a large-size polymer as a main component.

Furthermore, in the photolithography or in the electron beam lithography, when an open area ratio in a portion that has been subjected to lithography becomes large, a defect occurrence rate due to a foreign material disadvantageously becomes higher. Also, in the electron beam lithography, the large open area ratio reduces the throughput. Thus, a negative-tone resist is required. Sensitivity of resist is directly involved with the throughput. Therefore, a chemically-amplified resist is desirable, which has high sensitivity.

The resists using calixarene described in Non-Patent Document 1 and Non-Patent Document 2 provide high resolution and low LER. The resists, however, are non-chemically-amplified resists, and therefore the sensitivities are low. In the case of the resist using chloromethylated calixarene, development is performed with an organic solvent, and therefore there are the problems of toxicological properties and flammability. There is also the problem that the resist can hardly be applied to mass production lines of semiconductors. This is because development is generally performed with an alkaline aqueous solution.

Patent Document 2 includes descriptions concerning a low molecular compound based chemical amplification system negative-tone resist that is not increased in the molecular weight caused by lactonization which is an intra-molecular esterification reaction. This resist has four or more carboxyl groups per molecule. However, since the number of carboxyl group is large, dimeric structure is formed in which carboxyl groups having different molecules are stable, which may inhibit acid-catalyzed lactonization. Therefore, post exposure baking (PEB) at a high temperature is required for forming a pattern. When PEB is performed at a high temperature, the diffusion length of an acid becomes larger, which noticeably lowers the resolution.

With a photoresist compound according to the present invention and negative-tone resist using the compound, it has been found that it is possible to solve the problems in microfabrication of the semiconductors and in resist materials used for the process.

The configuration of the present invention is as described below.

which may have a substituent group. More specifically, a compound selected from the groups consisting of compounds expressed by chemical formula 7 shown in FIG. 6A to 6C may be used. However, the compound applicable to the present invention is not limited to those described above.

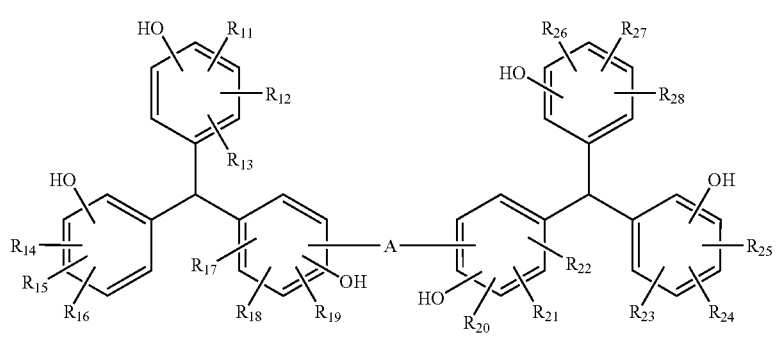

(6)

The photoresist compound according to the present invention is a molecule having three or less functional groups which are chemically converted from the polar state to the nonpolar state due to an action of an acid with the reduced solubility in alkaline developer. The resist material using the photoresist compound according to the present invention is required to have durability in dry etching and capability of forming an amorphous thin film, and therefore a polyphenol compound having excellent durability in dry etching is used to provide the photoresist compound according to the present invention. Preferably, a polyphenol compound having three or more and twelve or less phenolic nuclei is used. Herein the phenolic nucleus is defined as a unit structure which is equivalent to a structure of a phenol molecule expressed by chemical formula (5):

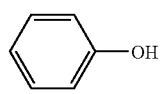

(5)

The polyphenol used herein means a compound having a structure with plural phenolic nuclei in one molecule. In the polyphenol compound, when the molecular weight is too small, the volatility becomes higher. Also, the crystallinity becomes higher to disable formation of an amorphous thin film. There is also the problem that, when the molecular weight is too large, the molecular size is larger than that of required LER.

A compound expressed by chemical formula (6) is one of the polyphenol compounds, which is preferably used in the present invention. The polyphenol compound in the formula (6) with functional groups linked thereto which are chemically converted from the polar state to the nonpolar state due to an action of an acid with the reduced solubility in alkaline developer. In chemical formula (6), $R_{11}$ to $R_{28}$ may be either identical to or different from each other, and denote a hydrogen atom, a linear alkyl group, a branched alkyl group, and an alkenyl group. The symbol A denotes a methylene group In addition to the compounds described above, any one selected from the group consisting of those expressed by formula 8 shown in FIG. 7 to FIG. 10 and by formula 19 shown in FIG. 14A to 14C may be used in the present invention.

A functional group, which is present in the photoresist compound according to the present invention and is chemically converted from the polar state to the nonpolar state due to an action of an acid with the reduced solubility in alkaline developer, is one that can be converted from the polar state to the nonpolar state. As a representative example, the polar group is γ- or δ-hydroxycarboxyl acid, while the nonpolar group is preferably a γ- or δ-lactone system which is generated because of intra-molecular esterification of the polar group. Specifically, the γ-hydroxycarboxyl acid has a structure expressed by chemical formula (1), and the δ-hydroxycarboxyl acid has a structure expressed by chemical formula (2):

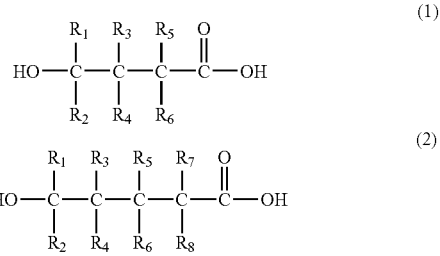

(1)

(2)

In the formulas (1) and (2) above, R1, R2, R3, R4, R5, R6, R7, and R8 denote an alkyl group having 1 to 10 hydrogen or carbon atoms. Any one of R1, R2, R3, R4, R5, R6, R7, and R8 is ether-linked to a hydroxyl group of the polyphenol. When a linkage between the γ- or δ-hydroxycarboxyl acid used as a polar group with the reduced solubility in alkaline developer due to an action of an acid, and a hydroxyl group in the polyphenol through an ether bond is expressed with the unit structure expressed by the chemical formula (5), structures expressed by chemical formula 9 ((31) to (34).) shown in FIG. 11A to 11D and those expressed by chemical formula (9) ((35) to (37)) shown in FIG. 12A to 12C are obtained.

In the compound having the structure of γ- or δ-hydroxycarboxyl acid, according to the present invention, the solubility in alkaline developer is reduced due to an action of an acid through the mechanisms expressed by chemical formulas (10-1) and (10-2) shown in FIG. 13. More specifically, because dehydration between a carboxylgroup and an alcoholic hydroxyl group occurs in a molecule and esterification (lactonization) occurs in the molecule, the functional group is converted from a polar structure in which the solubility in alkaline developer is promoted to a nonpolar structure in which the solubility in alkaline developer is decreased. Chemical formulas (10-1) and (10-2) shows representative examples. In other types of hydroxycarboxyl acids expressed by chemical formula 9 shown in FIG. 11 and FIG. 12, dehydration occurs between a carboxyl group and an alcoholic hydroxyl group. As a result, the solubility in alkaline developer is reduced. At least one γ- or δ-hydroxycarboxyl acid structure is required in one molecule.

A molecular size is described below.

The number of phenol unit structures in the photoresist compound according to the present invention is preferably in the range from 3 to 12. The actual number is decided according to coating properties of a radiation sensitive composition solution containing the photoresist compound and dimensions of a fine pattern to be formed with the radiation sensitive composition.

For the coating properties, the capability for forming an amorphous thin film is required. When the number of phenolic unit structures is less than 3, the molecular weight is small, and therefore the compound itself is hardly solidified, or crystallization easily occurs in the compound. Thus, the compound is not suitable for the present invention. When the number of phenolic unit structures is 3 or more, the molecular weight becomes large, which enables solidification and acquisition of an amorphous thin film.

From the viewpoint of the capability of forming a fine pattern, preferably the molecular size should be smaller, and more specifically the molecular size should be 2 nanometers or less. In the photoresist compound according to the present invention, the number of phenolic unit structures in a molecule of the photoresist compound is around 12 and the molecular diameter (size) is about 2 nanometers. When the number of phenolic unit structures is 13 or more, the molecular diameter is over 2 nanometers. For the reasons described above, it can be said that a compound having from 3 to 12 phenolic unit structures is appropriate for the photoresist compound according to the present invention.

Carboxyl acid easily forms a dimeric structure as expressed by chemical formula (11) due to a hydrogen bond in the solid phase. A dimer of carboxyl acid is stable when the dimer has a six-membered nucleistructure. When a dimer is formed between molecules each having the γ- or δ-hydroxycarboxyl acid structure, progress of lactonization by acidic catalyst is remarkably inhibited. Inhibition of the lactonization as described above occurs frequently because the probability of presence of carboxyl acid molecules at proximity becomes higher when the number of γ- or δ-hydroxycarboxyl acids in one molecule becomes larger. More specifically, in the polyphenol compounds having 3 to 5 phenolic nuclei, when the number of γ- or δ-hydroxycarboxyl acids is 3 or more, a dimer of the carboxyl acids is easily formed. In the case of the polyphenol compounds having from 6 to 12 phenolic nuclei, when the number of γ- or δ-hydroxycarboxyl acids in a molecule is 4 or more, a dimer of the carboxyl acids is easily formed.

For the reasons as described above, when the molecule having a functional group, which is chemically converted due to an action of an acid with the reduced solubility in alkaline developer, is a polyphenol compound having from 3 to 5 phenolic nuclei, it is preferable to use a compound in which functional groups chemically converted due to an action of an acid with the reduced solubility in alkaline developer are linked to 1 or 2 phenolic hydroxyl groups in the molecule. In the case of a polyphenol compound having from 6 to 12 phenolic nuclei, it is preferable to use a compound in which functional groups chemically converted from the polar state to the nonpolar state due to an action of an acid with the reduced solubility in alkaline developer are linked to 6 to 12 phenolic hydroxyl groups in the molecule.

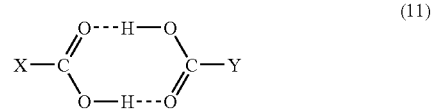

(11)

Furthermore, a functional group expressed by chemical formula (12) and referred to as tertiary carbinol can be used as the functional group chemically converted the polar state to the nonpolar state due to an action of an acid with the reduced solubility in alkaline developer in the photoresist compound according to the present invention. The tertiary carbinol is a functional group with high polarity. However, since dehydration occurs due to an action of acidic catalyst, the tertiary cardinol is converted to a nonpolar functional group.

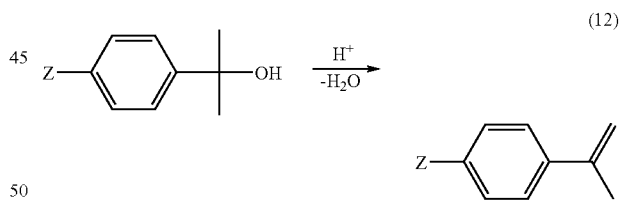

(12)

A negative-tome resist composition according to the present invention contains at least the photoresist compound according to the present invention and a photo acid generator which generates an acid when irradiated by radioactive ray. In addition, the negative-tone resist composition according to the present invention contains a solvent, a basic quencher compound, a surfactant, and the like.

A description is made of the solvent below.

The composition according to the present invention is dissolved in a solvent containing the components described above, and is coated onto a substrate. The solvents, which can be used in the present invention, includes ethylene dichloride, cyclohexanone, cyclopentanone, 2-heptanon, γ-butyrolactone, methyl ethyl ketone, ethylene glycol monomethyl ether, ethyleneglycol monoethylether, 2-methoxyethyl acetate, ethylene glycol monomethyl ether acetate, propylene glycol monomethyl ether, propylene glycol monoethyl ether, propylene glycol monomethyl ether propionate, toluene, ethyl acetate, methyl lactate, ethyl lactate, methyl methoxypropionate, ethyl methoxypropionate, methyl pyruvate, ethyl pyruvate, propyl pyruvate, N,N-dimethyl formamide, dimethyl sulfoxide, N-methyl pyrrolidone, tetrahydrofuran, linear ketone having from 6 to 9 carbon atoms, and γ-butyrolactone, and any of the solvents may be used singly or in combination with other one(s). It is preferable to use, as a coating solvent according to the present invention, propylene glycol methyl ether acetate, propylene glycol monomethyl ether propionate, propylene glycol monomethyl ether, methyl lactate, ethyl lactate, lineat ketone having from 6 to 9 carbon atoms, and γ-butyrolactone, and the coating solvents provide excellent in-plane uniformity. The linear ketone having 6 to 9 carbon atoms includes 2-heptanon, 2-octanon, and the like.

The resist composition according to the present invention is preferably dissolved in a solvent and then is filtered to remove insoluble impurity materials. A filter used for the purpose is selected from those usually used in the field to which the present invention pertains.

A description is made below of the photo acid generator.

As a photo acid generator used in the photoresist composition according to the present invention, any of compounds that generate an acid when irradiated by an electron beam, ultraviolet rays, X-ray, or the like may be used.

More specifically, the compound is selected from onium salt compounds (sulfonium salt compounds, iodonium salt compounds), sulfoimide compounds, sulfonyl methide compounds, organic halide compounds, sulfonic acid ester compounds, sulfonate compounds, and the like.

Representative photo acid generators are shown in FIG. 15 and FIG. 16.

One or more photoresist compositions selected from those listed above may be used in the photoresist composition according to the present invention singly or in combination.

A content of the photo acid generator in the photoresist composition according to the present invention as expressed with a weight ratio of the photo acid generator to the photoresist composition is in the range from 1% to 30%, and more preferably in the range from 5% to 20%. When a content of the photo acid generator is too small, there occurs the problem that the sensitivity is low, or that patterning can not be performed. When a content of the photo acid generator is too large, patterns formed may deteriorate, or the line edge roughness increases, or the resolution becomes lower.

A description is made of the quencher below.

A basic quencher compound may be added in the negative-tone resist composition according to the present invention for the purpose to improve the resolution. For the purpose, there is generally known the technique of irradiating radioactive ray to a desired pattern on a resist-applied film so that the acid component generated due to irradiation of radioactive ray is diffused in the resist film during the subsequent baking step for a chemical amplification reaction. In the negative-tone resist, the diffusion of the quencher compound is observed as a distribution of the acid component. By neutralizing the acid diffused in response to addition of the basic quencher compound, the deformation of patterns as described above can be suppressed, and as a result resolution of the resist is improved.

The basic quencher compound which may be used in the present invention should be more strongly basic as compared to phenols. A nitrogen-containing basic compound is especially preferable. Preferable compounds available for this purpose are those having the structures shown in FIG. 17A to FIG. 17E. In the chemical formulas shown in the figure, $R_{1250}$, $R_{1251}$, and $R_{1252}$ are identical to or different from each other, and are a hydrogen atom, an alkyl group having from 1 to 6 carbon atoms, an amino alkyl group having from 1 to 6 carbon atoms, a hydroxy alkyl group having 1 to 6 carbon atoms, or a substituted or not-substituted aryl group having from 6 to 20 carbon atoms. $R_{1250}$, $R_{1251}$, and $R_{1252}$ may be bonded to each other to form a ring. In the chemical formulas, $R_{1253}$, $R_{1254}$, $R_{1255}$, and $R_{1256}$ may be identical to or different from each other, and denote alkyl groups each having from 1 to 6 carbon atoms respectively. Preferable examples include substituted or not-substituted guanidine, substituted or not-substituted amino pyridine, substituted or not-substituted amino alkyl pyridine, substituted or not substituted amino pyrrolydine, substituted or not-substituted imidazole, substituted or not substituted pyrazole, substituted or not-substituted pyridine, substituted or not-substituted pyrimidine, substituted or not-substituted purine, substituted or not-substituted imidazolyn, pyrazoline, substituted or not-substituted piperazine, substituted or not-substituted amino morpholyn, and substituted or not-substituted amino alkyl morpholyn. Especially preferable compounds include, but not limited to, guanidine, 1,1-dimethyl guanidine, 1,1,3,3-tetramethyl guanidine, 2-amino pyridine, 3-amino pyridine, 4-phenyl pyridine, 4-amino pyridine, 2-dimethylamino pyridine, 4-dimethylamino pyridine, 2-diethylamino pyridine, 2-(amino methyl) pyridine, 2-amino-3-methyl pyridine, 2-amino-4-methyl pyridine, 2-amino-5-methyl pyridine, 2-amino-6-methyl pyridine, 3-aminoethyl pyridine, 4-aminoethyl pyridine, 3-amino pyrrolydine, piperazine, N-(2-aminoethyl) piperazine, N-(2-aminoethyl) pyperidine, 4-amino-2,2,6,6-tetramethyl pyperidine, 4-piperidino-pyperidine, 2-iminopiperidine, 1-(2-aminoethyl) pyrrolydine, pyrazole, 3-amino-5-methyl pyrazole, 5-amino-3-methyl-1-p-tolylpyrazole, pyrazine, 2-(aminomethyl)-5-methyl pyrazine, pyrimidine, 2,4-diamino pyrimidine, 4,6-dihydroxy pyrimidine, 2-pyrazoline, 3-pyrazoline, N-amino morpholyn, N-(2-aminoethyl) morpholyn, 1,8-diazabicyclo[5,4,0]undeca-7-en, 1,5-diazabicyclo[4,3,0]nona-5-en, and 2,4,5-triphenyl imidazole.

The nitrogen-containing basic compounds may be used singly or in combination. A use rate of the nitrogen-containing basic compound relative to all of the components of the composition according to the present invention should be in the range from 0.001 to 10 weight %, and is preferably in the range from 0.01 to 2 weight %. When the content is less than 0.001 weight %, the effect of addition of the composition can not be obtained. On the other hand, when the content is more than 2 weight %, the sensitivity lowers or the resolution in a section that is not exposed becomes lower.

The surfactant according to the present invention is described below.

In addition, it is preferable for the present invention to use a fluorine-based and/or silicon-based surfactant. The fluorine-based and/or silicon-based surfactant includes a fluorine-based surfactant, a silicon-based surfactant, and a surfactant containing both a fluorine atom and a silicon atom. More specifically, the fluorine-based surfactants or silicon-based surfactants available in the present invention include F-top EF301, EF303 (produced by Shinakita Kasei (K.K)), Fluorad FC430, 431 (produced by Sumitomo 3M Co. Ltd), Megafac F171, F173, F176, F189, F08 (produced by DAINIPPON INK AND CHEMICALS INCORPORATED), Surflon S-382, SC-101, 102, 103, 104, 105, 106 (Produced by Asahi Glass Company), Troysol S-366 (Tryo Chemicals CO. Ltd.). Furthermore, also polysiloxane polymer KP-341 (produced by Shin-Ethu Chemical CO., Ltd.) can be used as a silicon-based surfactant. A blending quantity of the surface surfactant relative to a solid content of all compositions in the composition according to the present invention is generally in the range from 0.001 to 0.5 weight %, and more preferably in the range from 0.002 to 0.1 weight %. Surfactants other than the fluorine-based and/or silicon-based surfactants may be used in the present invention. More specifically, the other type of surfactants which can be used in the present invention include nonion-based surfactants including polyoxyethylene alkyl ethers such as polyoxyethylene lauryl ether, polyoxyethylene stearyl ether, polyoxyethylene cetyl ether, polyoxyethylene oleyl ether; polyoxyethylene alkylallyl ether such as polyoxyethylene octylphenol ether, and polyoxyethylene nonylphenol ether; polyoxyethylene propylene block copolymer; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan laurate, polyoxyethylene sorbitan palmitate, polyoxyethylene sorbitan monostearate, polyoxyethylene sorbitan trioleate, polyoxyethylene sorbitan tristearate. Also crylic acid-based or methacrylic acid-based (co)polymerized Polyflow No. 75, No. 95 (produced by Kyoueisha Fatty Chemical Industry Co. Ltd.) may be used for this purpose. A blending quantity of the other type of surfactant relative to all of the solid components in the composition according to the present invention is generally 2 weight % or below, and more preferably 0.5 weight % or below. These surfactants may be used singly or in combination.

Effects provided by addition of a surfactant include improvement in compatibility between the photoresist composition according to the present invention and a photo acid generator and reduction in roughness on a coated surface.

A description is now made of the developer below.

An alkaline aqueous solution of any of the following compounds can be used as a developer for the composition according to the present invention: inorganic alkalis such as sodium hydroxide, potassium hydroxide, sodium carbonate; primary amines such as ethyl amine, and n-propyl amine; ammonia water; secondary amines such as diethyl amine, di-n-butyl amine; tertiary amines such as triethyl amine, and methyl diethyl amine; alcohol amines such as dimethyl ethanol amine, and triethanol amine; quarternary ammonium salts such as tetramethyl ammonium hydroxide, and tetraethyl ammonium hydroxide; and cyclic amines such as pyrrole, and pyperidine. Furthermore, an appropriate quantity of alcohols or a surfactant may be added in the alkaline aqueous solution. It is preferable to use an aqueous solution of tetramethyl ammonium hydroxide with the concentration in the range from 0.05 to 10 weight %. When the concentration is less than 0.05%, the resist film is not dissolved. When the concentration is 10% or more, sensitivity of the resist remarkably decreases, the shape of prepared pattern decrease, and a certain pattern can not be formed.

The photoresist compound according to the present invention can be used as a negative-tone resist composition when used together with a photo acid generator which generates an acid when irradiated by radioactive ray. One or more photo acid generators selected from a photo acid generator referred to as onium salt such as sulfonium salt and iodonium salt, a photo acid generator based on sulfonic acid ester, an imido-based photo acid generator, and a triazine-based photo acid generator may be used in the present invention.

The method of forming a resist pattern according to the present invention comprises a step of acquiring a resist layer by applying the negative-tone resist composition according to the present invention onto a substrate, a step of irradiating radioactive ray to the resist layer, and a step of developing the resist layer irradiated by radioactive ray. As the radioactive ray for this purpose, any of the following rays may be used in the present invention: i-line (with the wavelength of 365 nm), KrF excimer laser beam (with the wavelength of 248 nm), ArF excimer laser beam (with the wavelength of 193 nm), EUV light beams (with the wavelength of 13.5 nm), electron beam, and X-ray.

The photo acid generator should preferably have the sensitivity to radioactive ray irradiated to the resist.

The alkaline developer used in the present invention is preferably an aqueous solution of tetraalkyl ammonium hydroxide having 1 to 5 carbon atoms.

In a method of manufacturing a semiconductor device according to the present invention, the negative-tone resist composition according to the present invention and the method of forming patterns according to the present invention are used.

The method of manufacturing a semiconductor device according to the present invention furthermore includes a step of forming a resist pattern by any of the method of forming a pattern described above, and a step of etching the substrate according to the pattern or a step of implanting ions on the substrate according to the pattern. Dry etching method such as the plasma etching, reactive ion etching, reactive ion beam etching or wet etching may be employed in the etching process used in the method of manufacturing a semiconductor according to the present invention. The substrate processed in the method of manufacturing a semiconductor according to the present invention includes a silicon dioxide film formed by the CVD method or the thermal oxidation method, an oxide film such as a glass film with coating properties, and a nitride film such as a silicon nitride film. Furthermore a metallic film made of various metals such as aluminum, an aluminum alloy, and tungsten and polycrystalline silicon may be used in the method according to the present invention.

With the present invention, negative-tone resist having high resolution and low line edge roughness can be realized.

BRIEF DESCRIPTION OF THE DRAWINGS

FIG. 5 is a table showing synthetic materials and photoresist compounds obtained by using the synthetic materials according to the present invention and results of evaluation of the resolution of the photoresist compounds;

DETAILED DESCRIPTION OF THE PREFERRED EMBODIMENTS

Figure 1:
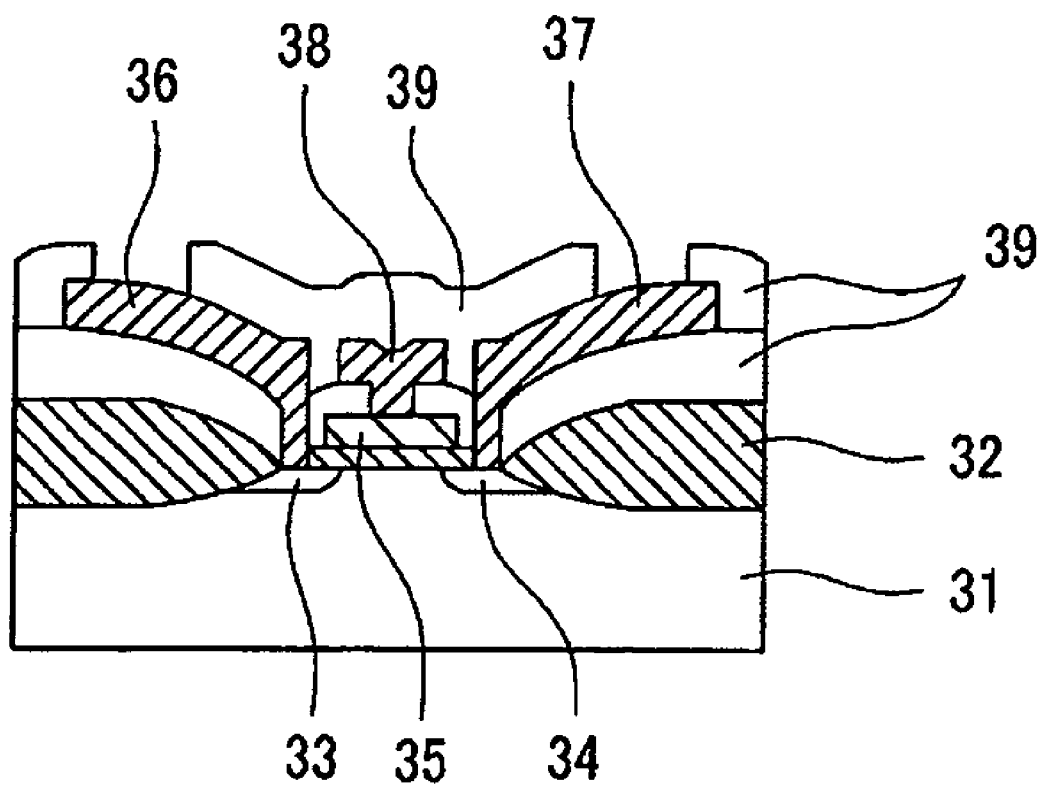
FIG. 1 is a cross-sectional view illustrating a MOS-type (metal-oxide-semiconductor) transistor.

Embodiments of the present invention are described in detail below. However, the present invention is not limited to the embodiments.

Embodiment 1

In this embodiment, a method of synthesizing photoresist compounds (A1, A2) according to the present invention is described.

Polyphenol compound 3M6C-MBSA (15 g) and potassium carbonate (7 g) were added to acetone (300 ml), and the mixture was sufficiently strirred. Then, acetone (50 ml) with α-bromo-γ-butyrolactone (6.0 g) was added to the above acetone (300 ml) with polyphenol compound 3M6C-MBSA (15 g) and potassium carbonate (7 g) at the room temperature. This mixed solution was strirred for two hours. After the reaction was completed, water (50 ml) was added to the mixture solution and acetone was removed by evapolation. THF (300 ml) was added, and an aqueous solution with 2.38% TMAH was added to the resultant solution with stirring until the pH was adjusted to about 11. After stirring continued for 2 hours at the room temperature, THF was removed by evaporation, ethyl acetate (200 ml) was added to the remaining solution, and then aqueous solution with 1% hydrochloric acid was added with heavy stirring until pH was adjusted to about 5. The organic layer was washed with water and a saturated sodium chloride aqueous solution, dried with sodium sulfate, and condensed to obtain a photoresist compound (A1) (16 g). The number of introduced γ-hydroxycarboxylic acid moiety obtained from the 1H-NMR was 2.0 per molecule on average.

In the same synthesizing method, a quantity of added α-bromo-γ-butyrolactone was reduced to 4.0 g to obtain a photoresist compound (A2). The number of introduced γ-hydroxycarboxylic acid moiety was 1.1 per molecule on average.

COMPARATIVE EXAMPLE 1

This comparative example describes a method of synthesizing a compound prepared by introducing 4 or more γ-hydroxycarboxylic acid molecules into a polyphenol compound.

Polyphenol compound 3M6C-MBSA (15 g) and potassium carbonate (16 g) were added to acetone (300 ml), and the mixture was sufficiently strirred. Then, acetone (50 ml) with α-bromo-γ-butyrolactone (10.0 g) was added to the mixture at the room temperature, and the mixed solution was strirred for two hours at 50° C. After the reaction was completed, water (50 ml) was added to the mixture solution and acetone was removed by evapolation. THF (300 ml) was added, and an aqueous solution with 2.38% TMAH was added to the resultant solution with stirring until the pH was adjusted to about 11. After stirring continued for 2 hours at the room temperature, THF was removed by evapolation, ethyl acetate (200 ml) was added to the remaining solution, and then an aqueous solution with 1% hydrochloric acid was added with heavy stirring until pH was adjusted to about 5. The organic layer was washed with water and a saturated sodium chloride aqueous solution, dried with sodium sulfate, and condensed to obtain a photoresist compound (A3) (16 g). The number of introduced γ-hydroxycarboxylic acid molecules obtained from the 1H-NMR was 4.2 per molecule on average.

In the same synthesizing method, a quantity of added α-bromo-γ-butyrolactone was increased to 13.0 g to obtain a photoresist compound (A4). The number of introduced α-bromo-γ-butyrolactone was 5.4 per molecule on average.

Embodiment 2

This embodiment provides a method of synthesizing photoresist compounds (A5, A6) prepared by introducing δ-hydroxycarboxylic acid into 3M6C-MBSA.

Polyphenol compound 3M6C-MBSA (15 g) and potassium carbonate (7 g) were added to acetone (300 ml), and the resultant mixture was sufficiently strirred. Then, acetone (50 ml) with α-bromo-δ-valerolactone (6.0 g) was added at the room temperature, and the mixture solution was strirred for 2 hours. After the reaction was completed, water (50 ml) was added and the acetone was removed by evapolation. THF (300 ml) was added to the mixture solution, and then an aqueous solution with 2.38% TMAH was added with stirring until pH was adjusted to about 11. Stirring continued for 2 hours at the room temperature, THF was removed by evapolation, ethyl acetate (200 ml) was added, and an aqueous solution with 1% hydrochloric acid was added with heavy stirring until pH was adjusted to about 5. The organic layer was washed with water and a saturated sodium chloride aqueous solution, dried with sodium sulfate, and condensed to obtain a photoresist compound (A5) (16 g). The number of introduced δ-hydroxycarboxylic acid molecules obtained by 1H-NMR was 2.0 per molecule on average.

In the same synthesizing method, a quantity of α-bromo-δ-valerolactone was reduced to 4.0 g to obtain a photoresist compound (A6). In this photoresist compound, the number of introduced δ-hydroxycarboxylic acid molecules was 1.0 per molecule on average.

COMPARATIVE EXAMPLE 2

This comparative example describes a method of synthesizing a composition prepared by introducing 4 or more δ-hydroxycarboxylic acid molecules into a polyphenol compound.

Polyphenol compound 3M6C-MBSA (15 g) was added to potassium carbonate (16 g), and the resultant mixture was sufficiently stirrred. Then, acetone (50 ml) with α-bromo-δ-valerolactone (10.0 g) was added at the room temperature, and the mixture solution was stirrred for 2 hours at 50° C. After the reaction was completed, water (50 ml) was added and the acetone was removed by evapolation. THF (300 ml) was added to the mixture solution, and then an aqueous solution with 2.38% TMAH was added with stirring until pH was adjusted to about 11. Stirring continued for 2 hours at the room temperature, THF was removed by evapolation, ethyl acetate (200 ml) was added, and an aqueous solution with 1% hydrochloric acid was added with heavy stirring until pH was adjusted to about 5. The organic layer was washed with water and a saturated sodium chloride aqueous solution, dried with sodium sulfate, and condensed to obtain a photoresist compound (A7) (16 g). The number of introduced δ-hydroxycarboxylic acid moiety obtained by 1H-NMR was 4.0 per molecule on average.

In the same synthesizing method, a quantity of α-bromo-δ-valerolactone was increased to 4.0 g to obtain a photoresist compound (A). In this photoresist compound, the number of introduced δ-hydroxycarboxylic acid molecules was 5.0 per molecule on average.

Embodiment 3

This embodiment provides a method of synthesizing a photoresist compound prepared by introducing γ- and δ-hydroxycarboxylic acids into a polyphenol compound other than the 3M6C-MBSA.

In the same synthesizing method as that described in Embodiment 1, a quantity of α-bromo-γ-butyrolactone added in a polyphenol as a feed was adjusted to an appropriate level by using the 25X-MBSA to obtain a photoresist compound (A9). In the photoresist compound (A9), the number of γ-hydroxycarboxylic acid introduced into the molecule was 1.2 on average.

Also the quantity was adjusted to an appropriate level by using α-bromo-δ-valerolactone in place of the α-bromo-γ-butyrolactone to obtain a photoresist compound (A10). In the photoresist compound (A10), the number of δ-hydroxycarboxylic acid introduced into the molecule was 1.1 on average.

Embodiment 4

This embodiment provides a method of forming a pattern by using the photoresist compound according to the present invention.

100 weight parts of the photoresist compound (A1) synthesized in Embodiment 1 and 2 weight parts of triphenyl sulfonium triflate as a photo acid generator (PAG-3) were dissolved in 500 weight parts of propylene glycol monomethylether acetate (PGMEA) and the mixture solution was subjected to filtering with a filter with a pore diameter of 0.20 μm to obtain a resist solution.

The resist solution was spin-coated onto a silicon substrate having been processed with hexamethyl disilazane. After the spin-coating, the silicon substrate was heated for 2 minutes at 100° C. to form a resist film with a thickness of 0.24 μm.

A line & space pattern was fabricated on the resist film on the substrate with an electron beam drawing apparatus with an acceleration voltage of 50 kV at an irradiation dose of 15 μC/cm$^2$. Then the resist film was subjected to annealing for 10 minutes at 100° C. to promote lactonization for reducing the solubility of a latent image portion of the resist in an alkali aqueous solution. After the annealing, the resist film with the latent image formed thereon was developed for 60 seconds with a 2.38 weight % aqueous solution of tetramethyl ammonium hydroxide to obtain a negative-tone resist pattern. A cross-sectional form of the line & space pattern with a thickness of 40 nm was observed with a scanning electron microscope. As a result, it was recognized that the resist pattern was rectangular and exhibited satisfactory resolution. A quantity of the film reduced after development was 5 nm or below. The line edge roughness (LER) value obtained from a measured SEM image of the 100 nm line & space pattern obtained after development was 3 nm.

Also when any of PAG-1, PAG-2, and PAG-4 to PAG-23 was used as a photo acid generator, it was recognized that an image having a 100 nm-thick resist film and a 50 nm line & space was resolved at a electron beam irradiation dose of 20 μC/cm$^2$.

Furthermore in the photoresist composition having the composition as described above, when any of octyl amine, 4-phenyl pyridine, and 4,4-dimethylamino pyridine was added to the photo acid generator by 3 weight %, the sensitivity dropped to 30 μC/cm$^2$ in any photo acid generator, but the line & space pattern with a thickness of 30 nm was resolved in the satisfactory state. The line edge roughness (LER) value in this case was 2.9 nm.

Embodiment 5

This embodiment provides a method of forming a pattern by using the photoresist compound according to the present invention.

100 weight parts of the photoresist compound (A2) synthesized in Embodiment 1 and 1.5 weight parts of triphenyl sulfonium nonaflate as a photo acid generator were dissolved in 500 weight parts of cyclohexanone and the mixture solution was subjected to filtering with a filter with a pore diameter of 0.20 μm to obtain a resist solution.

The resist solution was spin-coated onto a silicon substrate having been processed with hexamethyl disilazane. After the spin-coating, the silicon substrate was heated for 2 minutes at 100° C. to form a resist film with a thickness of 0.21 μm. A line & space pattern was drawn on the resist film on the substrate with an electron beam drawing apparatus with an acceleration voltage of 50 kV at an irradiation dose of 15 μC/cm$^2$. Then the resist film was subjected to annealing for 10 minutes at 100° C. to promote lactonization for reducing the solubility of a latent image portion of the resist in an alkali aqueous solution. After the annealing, the resist film with the latent image formed thereon was developed for 60 seconds with a 2.38 weight % aqueous solution of tetramethyl ammonium hydroxide to obtain a negative-tone resist pattern. A cross-sectional form of the line & space pattern with a thickness of 40 nm was observed with a scanning electron microscope. As a result, it was recognized that the resist pattern was rectangular and exhibited satisfactory resolution. A quantity of the film reduced after development was 5 nm or below. The line edge roughness (LER) value obtained from a measured SEM image of the 100 nm line & space pattern obtained after development was 3 nm.

In the same method, patterning was performed using the compounds (A2), (A5), (A6), (A9), and (A10) each as a photoresist compound, and a line & space pattern with a thickness of 40 nm was obtained in the excellent state. A quantity of reduced film after development was 5 nm or below. The line edge roughness (LER) value obtained from a measured SEM image of the line & space pattern with a thickness of 100 nm obtained after development was 3.2 nm.

COMPARATIVE EXAMPLE 3

This comparative example describes a method of forming a pattern by using a photoresist compound with 4 or more γ- or δ-hydroxycarboxylic acid molecules synthesized in Comparative Examples 1 and 2 on average respectively introduced into each molecule.

100 weight parts of the photoresist compound (A3) synthesized in Comparative Example 1 and 3.5 weight parts of triphenyl sulfonium nonaflate as a photo acid generator were dissolved in 600 weight parts of cyclohexanone. The mixture solution was subjected to filtering with a pore diameter of 0.20 μm to obtain a resist solution.

The resist solution was spin-coated onto a silicon substrate having been processed with hexamethyl disilazane. After the spin-coating, the silicon substrate was heated for 3 minutes at 100° C. to form a resist film with a thickness of 0.3 μm. A line & space pattern was fabricated on the resist film on the substrate with an electron beam drawing apparatus with an acceleration voltage of 50 kV at an irradiation dose of 35 μC/cm$^2$. Then the resist film was subjected to annealing for 5 minutes at 130° C. to promote lactonization for reducing the solubility of a latent image portion of the resist in an alkali aqueous solution. After the annealing, the resist film with the latent image formed thereon was developed for 180 seconds with a 2.38 weight % aqueous solution of tetramethyl ammonium hydroxide to obtain a negative-tone resist pattern. As a result, it was recognized that a line & space pattern with a thickness of 300 nm or below could not be formed. After patterning, the resist film was heated for 10 minutes at 100° C. to find that no pattern was formed.

In the same method, patterning was performed by using the photoresist compounds (A4), (A7), and (A7) as the photoresist compounds, but a satisfactory negative-tone pattern could not be formed unlike in the case in which the material (A3) was used.

Embodiment 6

In this embodiment, description is provided for a method of forming a pattern by using an EUV light beam. 100 weight parts of the photoresist compound (A1) synthesized in Embodiment 1 and 1.5 weight parts of triphenyl sulfonium nonaflate as a photo acid generator were dissolved in 500 weight parts of 1-methoxy propanol. The mixture solution was subjected to filtering with a pore diameter of 0.10 μm to obtain a resist solution.

The resist solution was spin-coated onto a silicon substrate having been processed with hexamethyl disilazane. After the application, the silicon substrate was heated for 2 minutes at 100° C. to form a resist film with a thickness of 0.15 μm. A line & space pattern was drawn on the resist film on the substrate with a EUV exposure apparatus at an irradiation dose of 10 mJ/cm$^2$. Then the resist film was subjected to annealing for 5 minutes at 105° C. to promote lactonization for reducing the solubility of a latent image portion of the resist in an alkali aqueous solution. After the annealing, the resist film with the latent image formed thereon was developed for 40 seconds with a 2.38 weight % aqueous solution of tetramethyl ammonium hydroxide to obtain a negative-tone resist pattern.

A cross-sectional form of the line & space pattern with a thickness of 30 nm was observed with an electron microscope, and as a result it was recognized that the resist pattern was rectangular and exhibited satisfactory resolution. A quantity of the film reduced after development was 2 nm or below. The line edge roughness (LER) value obtained from a measured SEM image of the 100 nm line & space pattern obtained after development was 2 nm.

In the same method, patterning was performed using the photoresist compounds (A2), (A5), (A6), (A9), and (A10), and a line & space pattern with a thickness of 30 nm could be formed in the satisfactory state. A quantity of the film reduced after development was 2 nm be below. The line edge roughness (LER) value obtained from a measured SEM image of the 100 nm line & space pattern obtained after development was 2 nm.

Embodiment 7

This embodiment provides a method of manufacturing a transistor by using the method of forming a pattern according to the present invention.

FIG. 1 is a cross-sectional view illustrating a known MOS (metal-oxide-semiconductor) type transistor. The transistor has a structure in which a drain current flowing between a source electrode 36 and a drain electrode 37 is controlled by a voltage applied to a gate electrode 38. The process for forming the structure as described above comprises 10 or more steps, and the steps are largely classified to those up to formation of a field oxide film, those up to formation of a gate, and the final steps. The steps up to formation of a field oxide film (refer to FIG. 2A to 2H) include a step of a resist pattern on a silicon nitride film. Formation of the field oxide film was performed as described below.

Figure 2A:
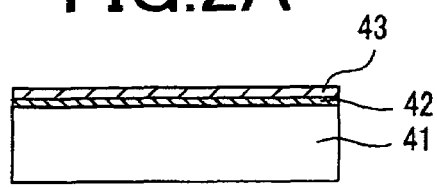
FIGS. 2A to 2H are views illustrating a field oxide film prepared by a method of forming a pattern according to the present invention, and a method of forming a silicon gate.
Figure 2F:
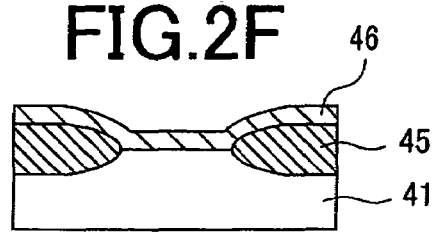
Figure 2B:
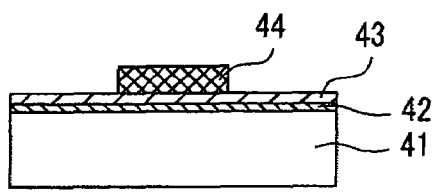

With a known method, an oxide film 42 with a thickness of 20 nm is formed on a p-type silicon wafer 41 as shown in FIG. 2A, and a silicon film with a thickness of 70 nm is formed on the oxide film 42 by means of plasma CVD to form a substrate. The material described in Embodiment 1 was used to form on this substrate a resist pattern 44 with a thickness of 50 nm by means of the method of forming a pattern described in Embodiment 4 (FIG. 2B). After the silicon nitride film is etched with a known method using the resist pattern as a mask (FIG. 2C), this resist is again masked, and boron ion implantation is performed for a channel stopper.

Figure 2G:
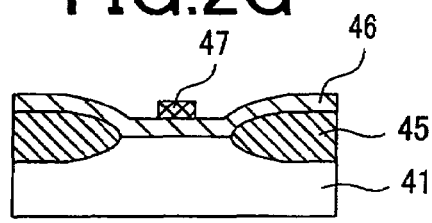
Figure 2C:
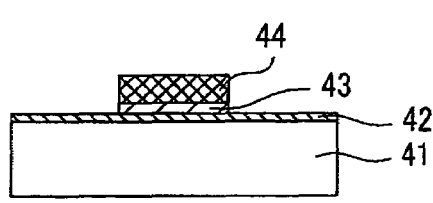
Figure 2H:
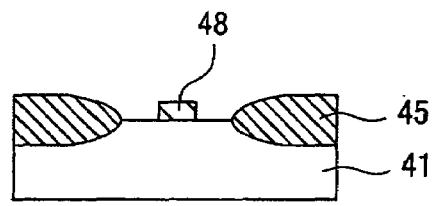
Figure 2D:
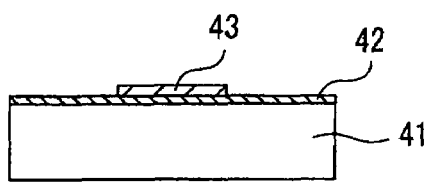
Figure 2E:
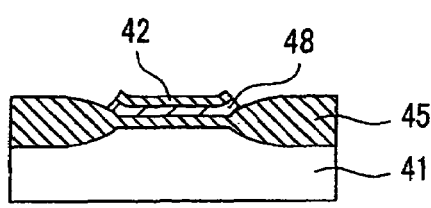

After the resist is separated (FIG. 2D), a field oxide film with a thickness of 0.5 μm is formed in an element separation area by selective oxidation using the silicon nitride film as a mask (FIG. 2E). Then, the steps for forming a gate and the final steps are performed by employing a known method. After the silicon nitride film was etched, the gate is oxidized to make polycrystalline silicon grow (FIG. 2F). A resist pattern with a 50 nm line is formed on this substrate by employing the method of forming a pattern described in Embodiment 1 (FIG. 2G). Using this resist pattern as a mask, the polycrystalline silicon is etched with a known method to form a gate (FIG. 2H). The thin oxide film at the source and the drain is etched, and then arsenic is distributed in the polycrystalline silicon gate as well as the source and drain to form an oxide film in the polycrystalline silicon gate as well as in the source and drain regions. Contacts for aluminum wiring to the gate, the source, and to the drain are opened, and then aluminum deposition and patterning are performed, and further more a protective film is formed with a pad for bonding opened. The MOS thermoplastic elastomer transistor as shown in FIG. 1 is formed as described above.

The method of forming a field oxide film was described above especially in the case of the MOS type transistor, but it is needless to say that the present invention is not limited to this case, and the present invention may be applicable to other methods and steps of manufacturing a semiconductor.

Embodiment 8

Figure 3A:
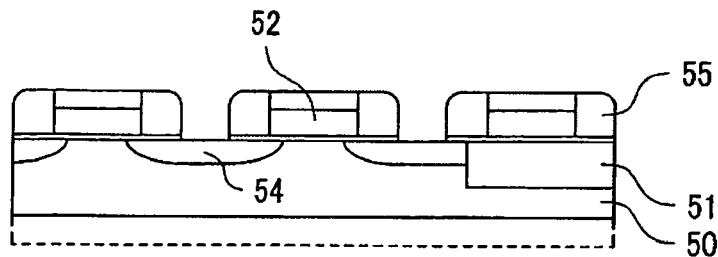
FIGS. 3A to 3D are a cross-sectional view schematically showing a process of manufacturing a device with the method of forming a pattern according to the present invention.
Figure 3B:
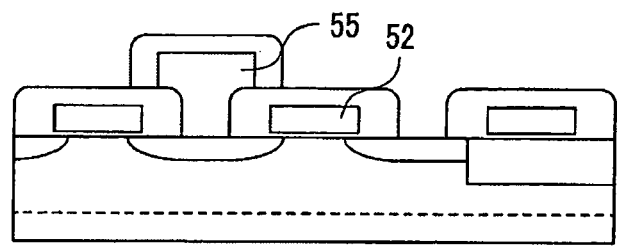
Figure 3C:
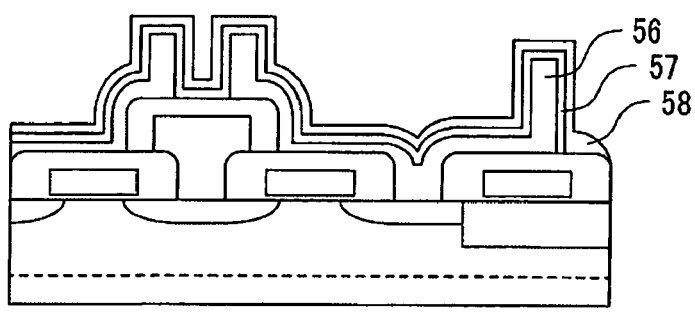
Figure 3D:
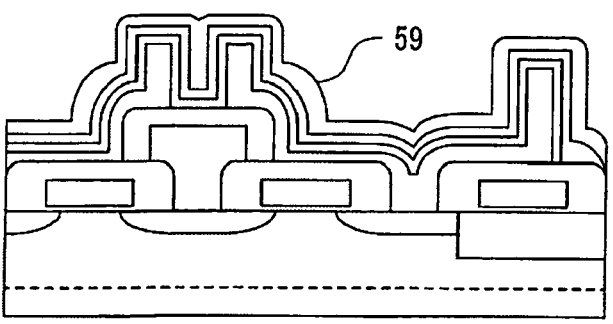

In this embodiment, a method of a semiconductor memory element by using the material described in Embodiment 2 is described with reference to FIG. 3A to 3D and FIG. 4. FIG. 3A to 3D are a cross-sectional view illustrating main steps in a manufacturing process of the element. As shown in FIG. 3A, using a P-type Si semiconductor 50 as a substrate, a element-isolated region is formed on the surface with a known element isolation technique. Then, for instance, a word line having a structure in which a polycrystalline Si layer with a thickness of 150 nm and an $SiO_2$ layer with a thickness of 200 nm are laminated is formed. Furthermore, using the chemical gas phase growth method, for example, an $SiO_2$ film with a thickness of 150 nm is coated and the film is anisotropically processed to form a side spacer 53 made of $SiO_2$ on a side wall of the word line. Then an n diffusion layer 54 is formed by the ordinary method. Then, as shown in FIG. 3B, a data line 55 made of polycrystalline Si, high melting point metal silicide, or a laminated film made of these materials is formed. Then, as shown in FIG. 3C, a storage electrode 56 made of polycrystalline Si is formed through the ordinary steps. Then, $Ta_2O_5$, $Si_3N_4$, $SiO_2$, BST, PZT, a ferroelectric material, or a hybrid film made of the materials is coated to form an insulating film 57 for a capacitor. Then polycrystalline Si, a metal having a high melting point, metallic silicide having a high melting point, or a low-resistance conductor such as Al or CU are coated to form a plate electrode 58. Then as shown in FIG. 3D, wiring 59 is formed through the ordinary steps. Then a memory element is made through the ordinary wiring step or the passivation step. In this embodiment, only representative manufacturing processes have been described, and the ordinary manufacturing may be employed.

In this embodiment, the patterns having various structures as described above are performed by exposing the resist according to the present invention to the EUV. Especially, to form patterns of the device-isolation area, word line and data line, the negative-tone resist are used. To form a pattern of the storage electrode, positive-tone resists are used in combination. The resist material according to the present invention is not applied in a step for forming a step with a relatively large dimension such as a through-hole forming step in the passivation process or a step of forming a mask for ion implantation.

Figure 4:
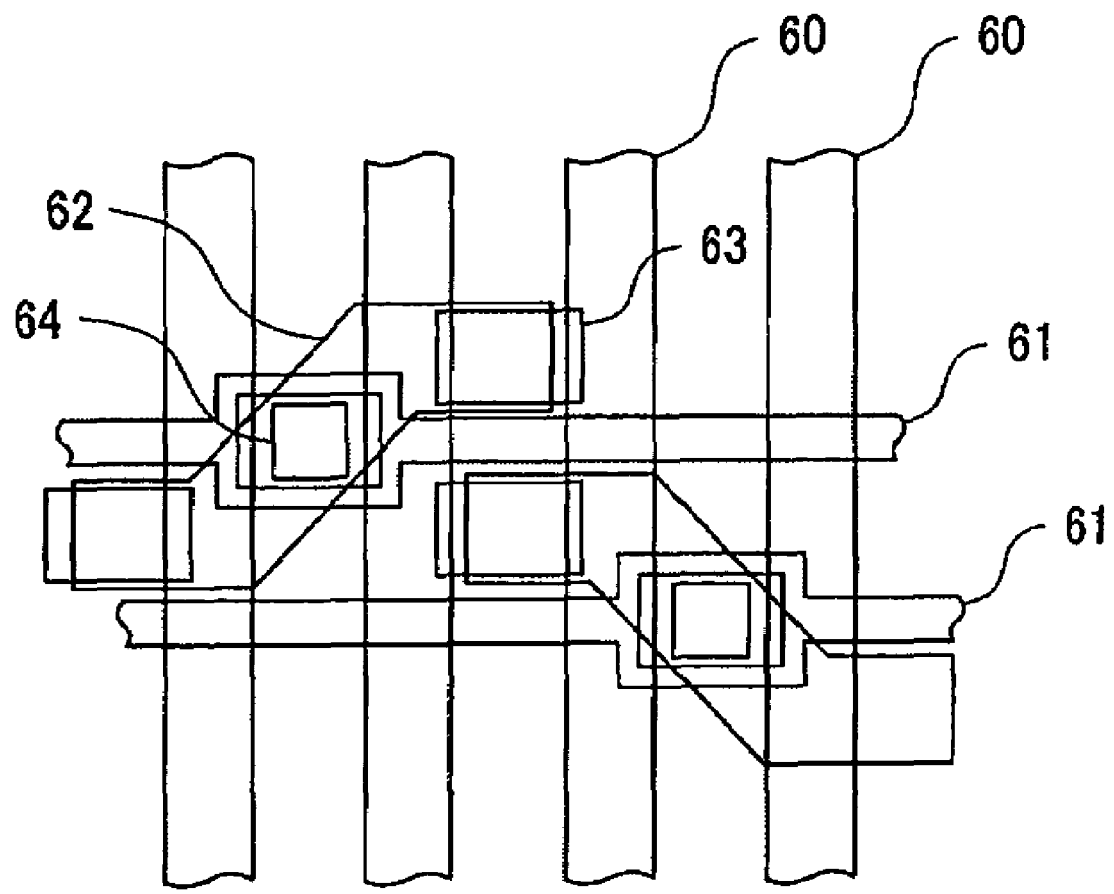
FIG. 4 is a schematic view illustrating a planar configuration of the device prepared with the method of forming a pattern according to the present invention.
Figure 6A:
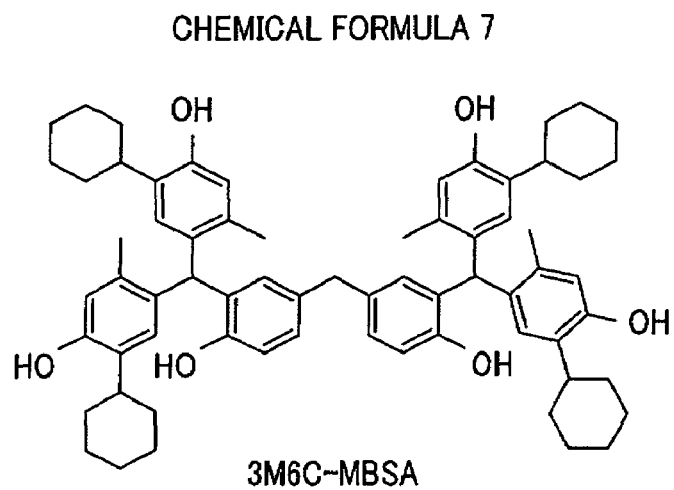
FIG. 6A to 6C are views illustrating specific examples of polyphenol compounds according to embodiments of the present invention.
Figure 6B:
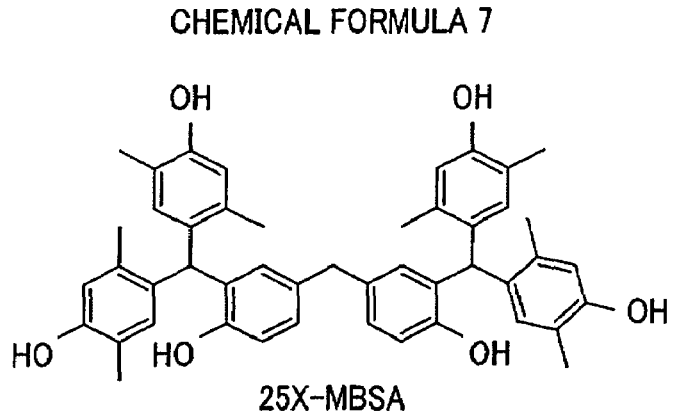
Figure 6C:
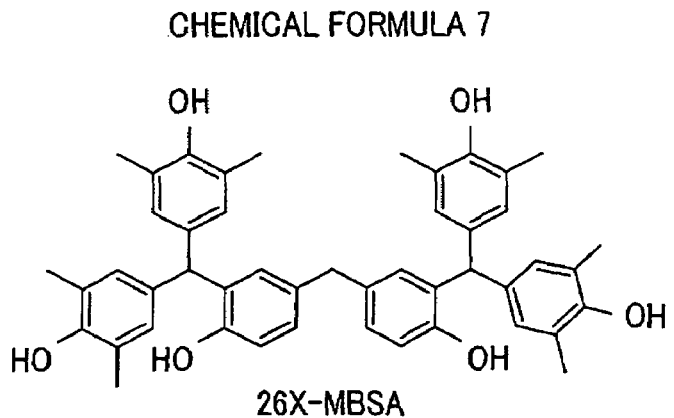
Figure 7A:
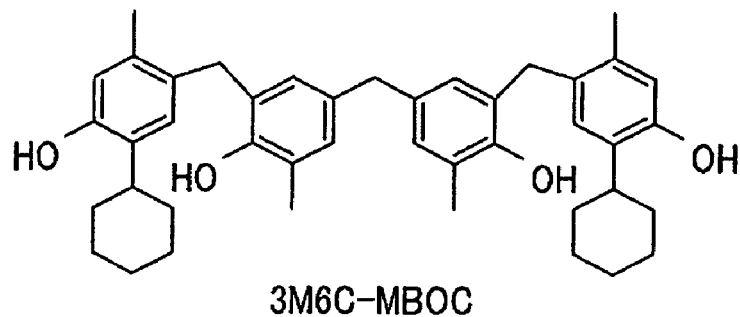
FIG. 7A to 7C are views illustrating the polyphenol compounds according to the embodiments of the present invention.
Figure 7B:
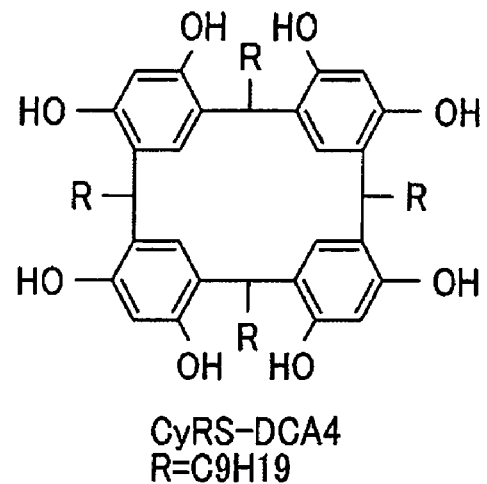
Figure 7C:
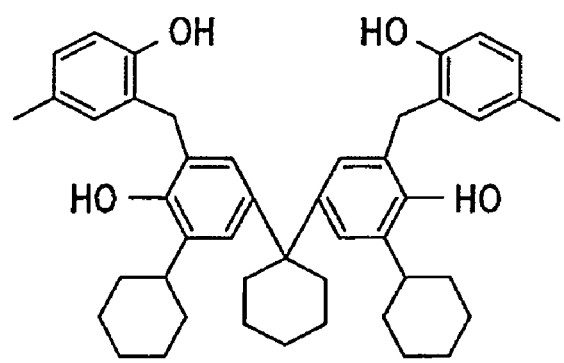
Figure 8A:
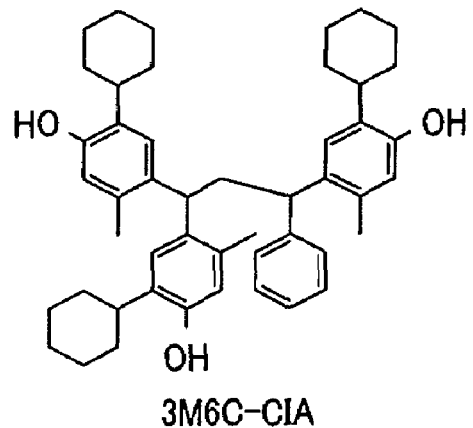
FIG. 8A to 8C are views illustrating the polyphenol compounds according to the embodiments of the present invention.
Figure 8B:
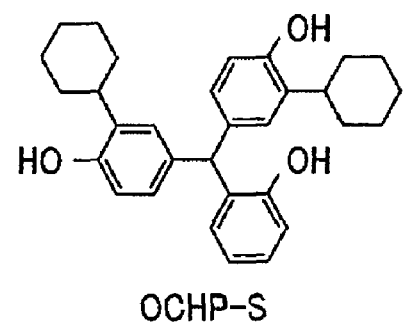
Figure 8C:
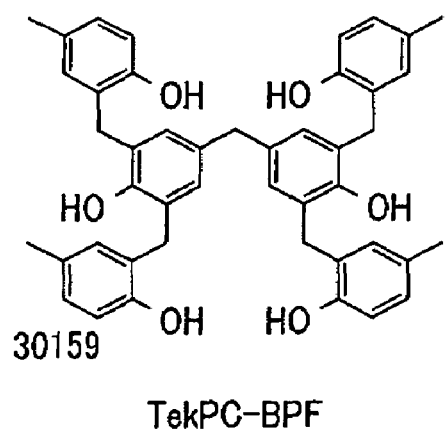
Figure 9A:
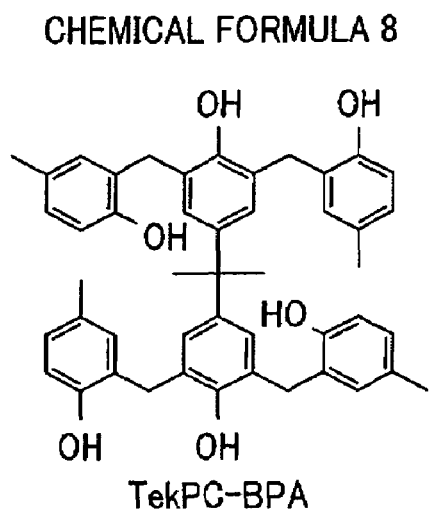
FIG. 9A to 9C are views illustrating the polyphenol compounds according to the embodiments of the present invention.
Figure 9B:
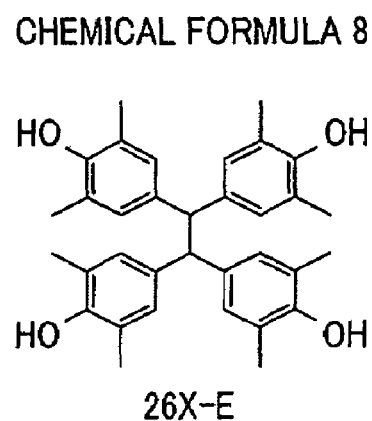
Figure 9C:
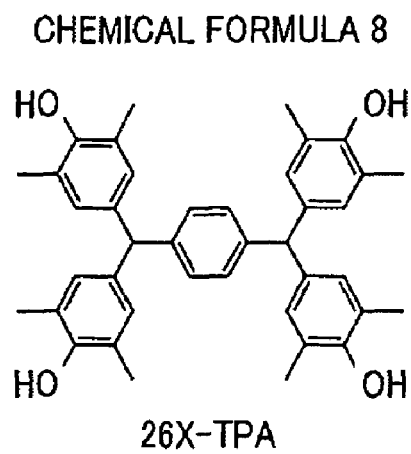
Figure 10A:
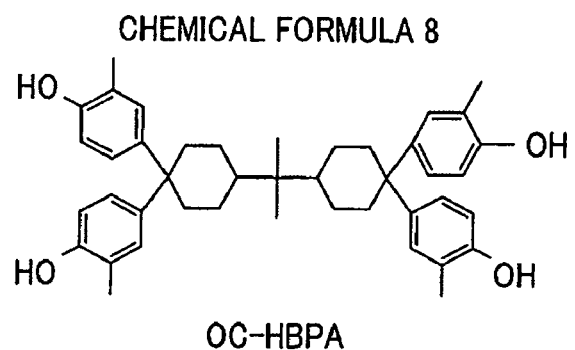
FIG. 10A to 10D are views illustrating the polyphenol compounds according to the embodiments of the present invention.
Figure 10B:
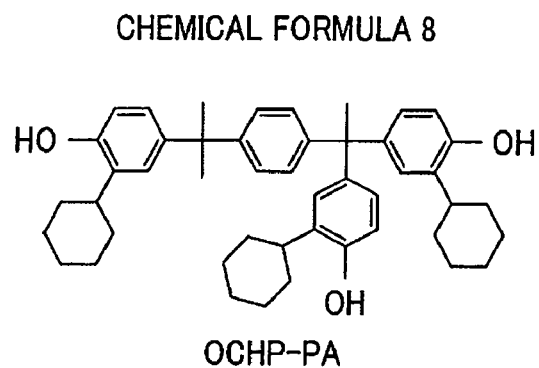
Figure 10C:
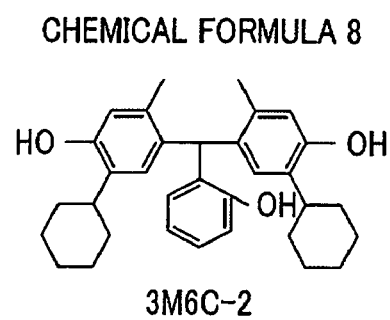
Figure 10D:
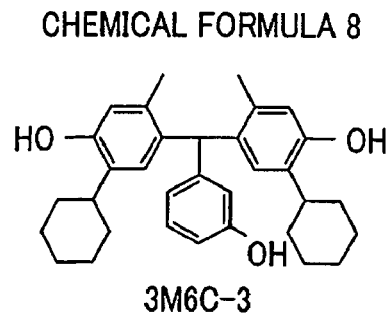
Figure 11A:
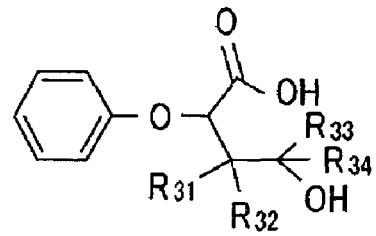
FIG. 11A to 11D are views illustrating a structure obtained when γ- or δ-hydroxycarboxylic acid is ether-linked to a hydroxyl group of a polyphenol.
Figure 11B:
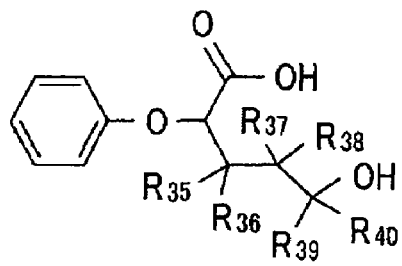
Figure 11C:
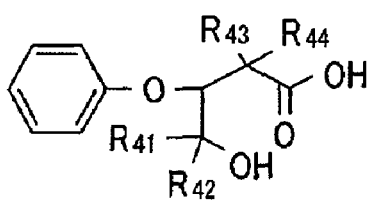
Figure 11D:
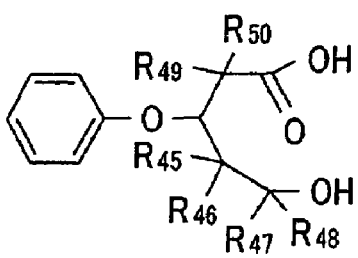
Figure 12A:
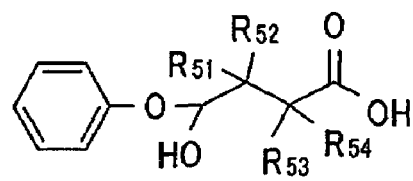
FIG. 12A to 12C are views illustrating a structure obtained when γ- or δ-hydroxycarboxylic acid is ether-linked to a hydroxyl group of a polyphenol.
Figure 12B:
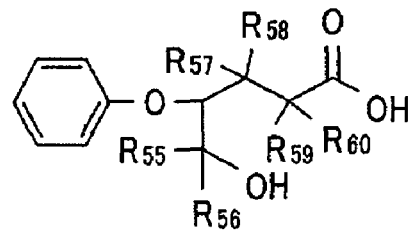
Figure 12C:
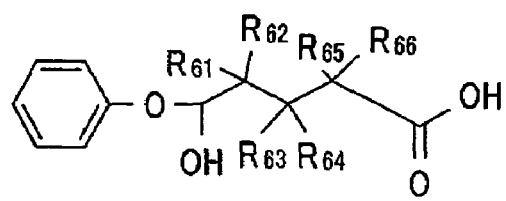
Figure 13A:
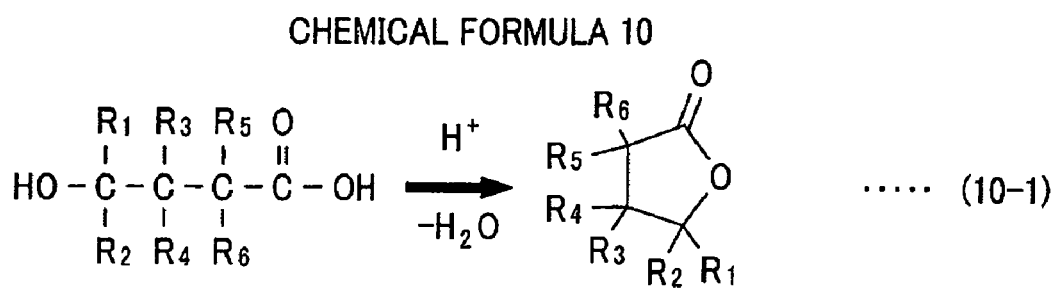
FIG. 13A to 13B are views illustrating a mechanism for reduction of the solubility of a compound having a structure of hydroxycarboxylic acid in an alkaline developer due to an action of an acid.
Figure 13B:
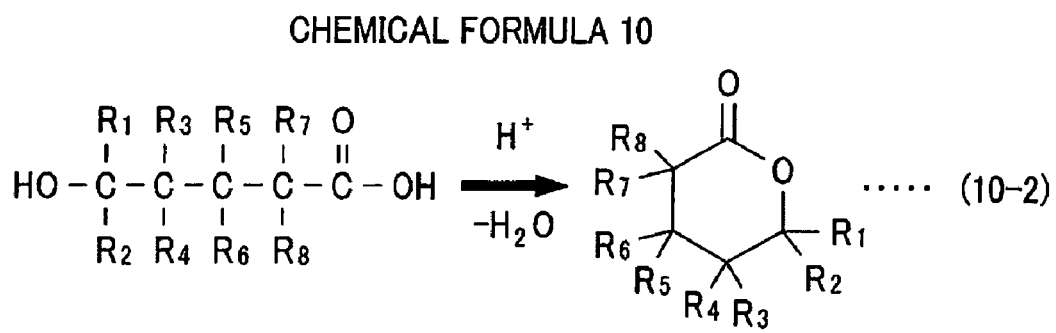
Figure 14A:
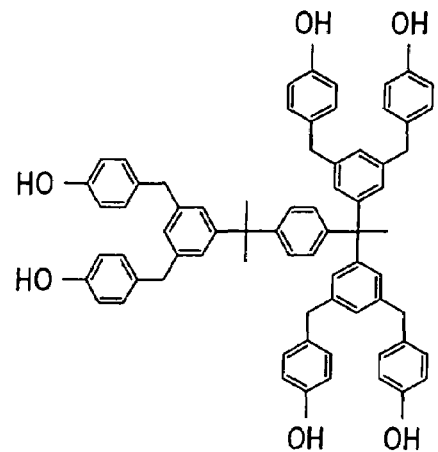
FIG. 14A to 14C are views illustrating polyphenol compounds according to the embodiments of the present invention.
Figure 14B:
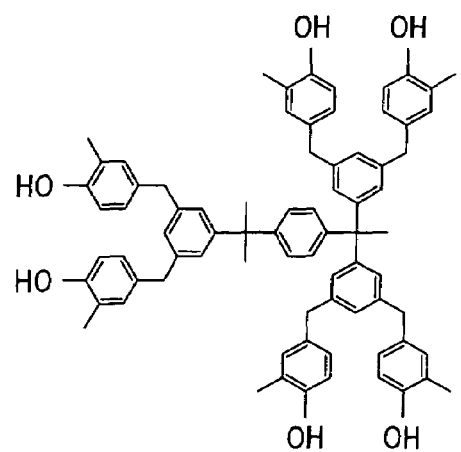
Figure 14C:
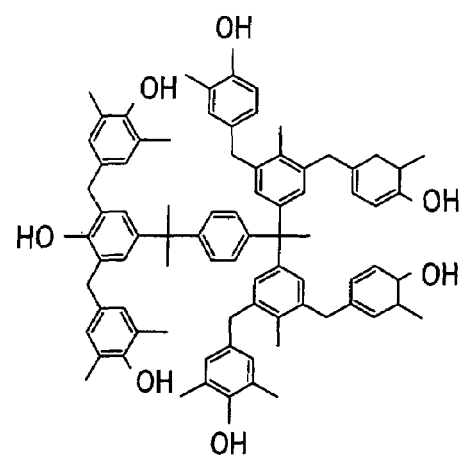
Figure 15:
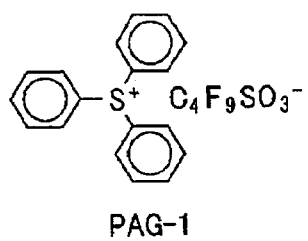
FIG. 15 is a view illustrating representative photo acid generators used in embodiments of the present invention.
Figure 15:
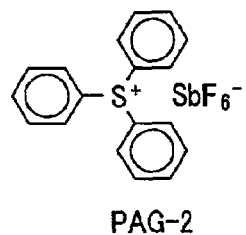
Figure 15:
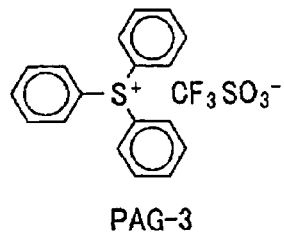
Figure 15:
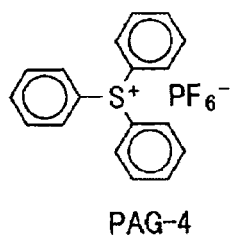
Figure 15:
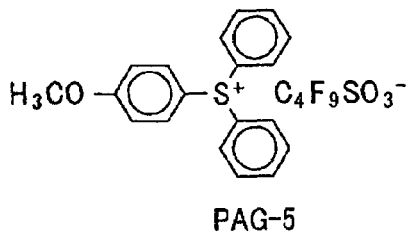
Figure 15:
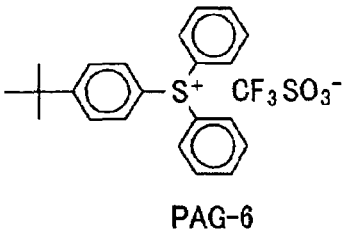
Figure 15:
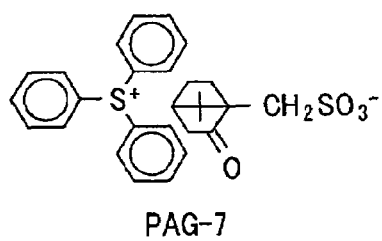
Figure 15:
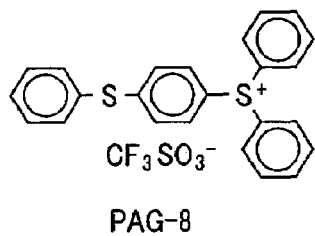
Figure 15:
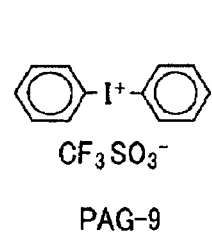
Figure 15:
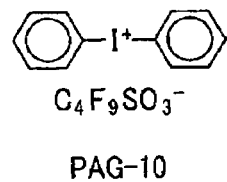
Figure 15:
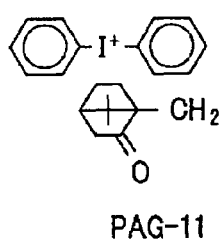
Figure 15:
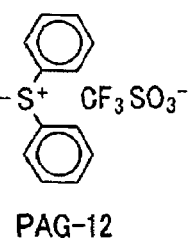
Figure 16:
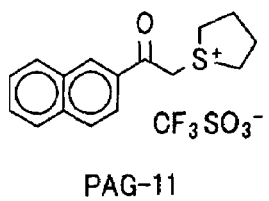
FIG. 16 is a view illustrating representative photo acid generators according to the embodiments of the present invention.
Figure 16:
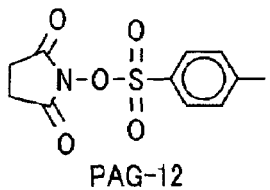
Figure 16:
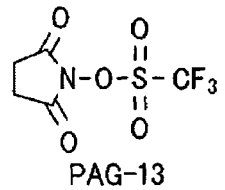
Figure 16:
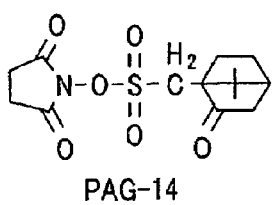
Figure 16:
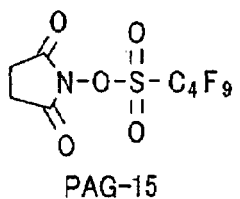
Figure 16:
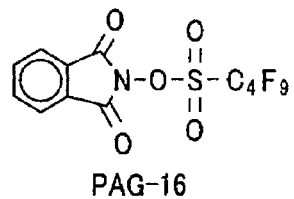
Figure 16:
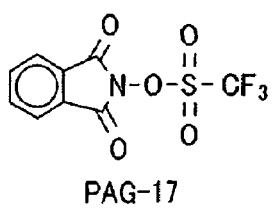
Figure 16:
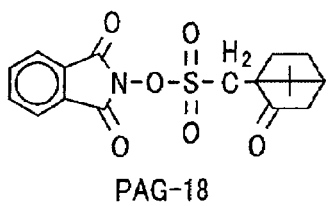
Figure 16:
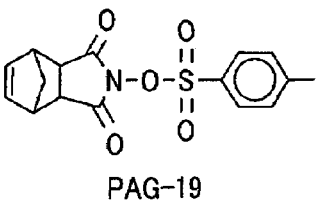
Figure 16:
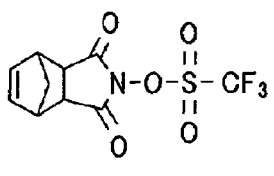
Figure 16:
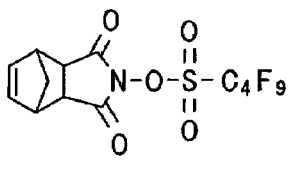
Figure 16:
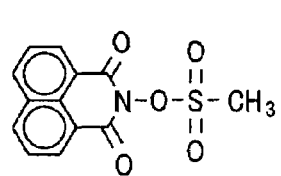
Figure 16:
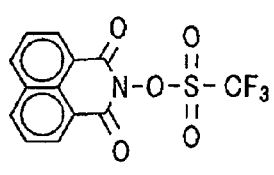
Figure 16:
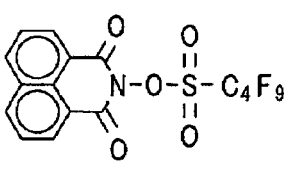
Figure 16:
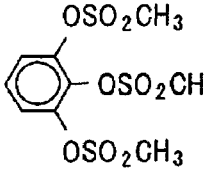
Figure 16:
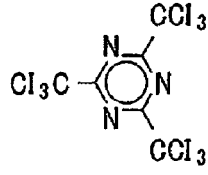
Figure 17A:
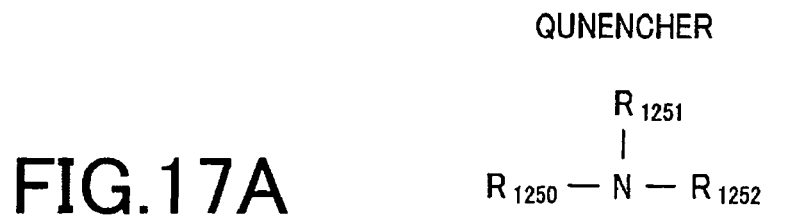
FIG. 17 is a view illustrating structures of basic quencher compounds according to the embodiments of the present invention.
Figure 17B:
Figure 17C:
Figure 17D:
Figure 17E:
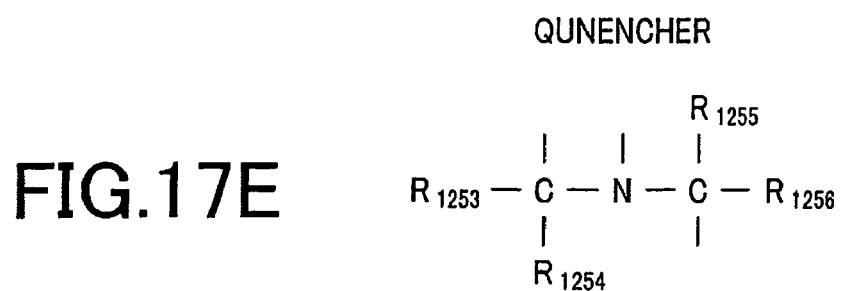

A pattern formed by lithography is described below. FIG. 4 is a pattern arrangement in a memory block as a representative pattern constituting the manufactured memory device. Reference numeral 60 denote a word line, 61 a data line, 62 an active area, 63 a storage electrode, and 64 a pattern of an electrode lead-out hole. Also in this case, all of the sections other than the electrode extraction hole 64 are formed by the method according to the present invention. Also in formation of patterns other than those described herein, the present invention is employed in the steps performed according to the minimum design rule.

The device manufactured by the method according to the present invention has smaller inter-pattern dimensions as compared to those in devices manufactured by the conventional technique. Because of the feature, size of devices having the same configuration can be reduced, and the number of devices to be manufactured from a sheet of wafer in the semiconductor device manufacturing process increases, which provides the improved yield.

Embodiment 9

This embodiment provides a method of forming a pattern by using the photoresist compound according to the present invention. The polyphenol compounds shown in FIG. 6 to FIG. 10 and FIG. 14 were used as starting materials and reacted to the α-bromo-γ-butyrolactone respectively to obtain photoresist compounds (A11) to (A27) with one γ-hydroxy-carboxylic acid introduced into each molecule. 100 weight parts of each of the photoresist compounds obtained and 5.5 weight parts of triphenyl sulfonium nonaflate as a photo acid generator were dissolved in 800 weight parts of cyclohexanone to obtain a resist solution (photoresist composition). The resist solution was spin-coated on a silicon substrate processed by hexamethyl disilazane, and the silicon substrate was heated for 3 minutes at 100° C. after the spin-coating to form a resist film with a thickness of 0.2 μm.

Using an electron beam drawing device with the acceleration voltage of 50 kV, a line & space pattern was drawn on the resist film formed on the substrate with a proper irradiation dose, and the substrate was heat for 4 minutes at 120° C. to promote lactonization for reducing the solubility of a latent image portion of the resist in an alkaline solution. After the annealing, the resist film with a latent image formed by using a 2.38 weight % aqueous solution of tetramethyl ammonium hydroxide was developed for 150 seconds to obtain a negative-tone resist pattern. A cross-sectional form of the line & space pattern with a thickness of 40 nm was observed with an electron microscope, and it was recognized that the resist pattern was rectangular and exhibited satisfactory resolution. A quantity of the film reduced thickness after development was 5 nm or below. The materials used for synthesis, obtained photoresist compounds, and results of evaluation of resolution of the materials are as shown in FIG. 5. Furthermore, the line edge roughness (LER) values obtained from measured SEM images of the obtained line & space patterns each with a thickness of 100 nm after the development are shown in Table 1.

Incidentally, a description will be made of reference numerals used in the figures of this application as below.

32, 45: . . . Field oxide film, 33: . . . Source contact, 34: . . . Drain contact, 35: . . . Polycrystalline silicon, 36: . . . Source electrode, 37: . . . Drain electrode, 38: . . . Gate electrode, 39: . . . Protective film, 42: . . . Oxide film, 44: . . . Resist pattern, 46: . . . Polycrystalline silicon film, 47: . . . Resist pattern, 48: . . . Polycrystalline silicon gate, 50: . . . P-type Si semiconductor, 51: . . . Element separation area, 52: . . . Word line, 53: . . . Side spacer, 54: . . . n-diffusion layer, 55: . . . Date line, 56: . . . Storage electrode, 57: . . . Insulating film for capacitor, 58: . . . Plate electrode, 59: . . . Wiring, 60: . . . Word line, 61: . . . Date line, 62: . . . Active area, 63: . . . Storage electrode, 64: . . . Electrode extraction hole.

What is claimed is:

1. A photoresist compound comprising:
a polyphenol compound molecule having three or less functional groups that are chemically converted due to an action of an acid with reduced solubility in alkaline developer, the photoresist compound being a photoresist compound capable of being used in a negative-tone resist composition and that is capable of being developed by the alkaline developer, wherein
the functional groups that are chemically converted due to an action of an acid with the reduced solubility in alkaline developer are capable of being converted from the polar state to the nonpolar state;
said functional groups are polar groups of γ- or δ-hydroxycarboxylic acid; and
said nonpolar state is a γ- or δ-lactone system that is generated by intra-molecular esterification of the polar group.

2. The photoresist compound according to claim 1, wherein
the molecule is a polyphenol compound having 3 to 12 phenol nuclei; and
the functional groups that are chemically converted due to an action of an acid with the reduced solubility in alkaline developer are linked to some of phenolic hydroxyl groups contained in the polyphenol compound.

3. The photoresist compound according to claim 1, wherein
the molecule is a polyphenol compound having 3 to 5 phenol nuclei; and
the functional groups that are chemically converted due to an action of an acid with the reduced solubility in alkaline developer are linked to 1 or 2 phenolic hydroxyl groups contained in the polyphenol compound.

4. The photoresist compound according to claim 1, wherein
the functional groups linked to some of phenolic hydroxyl groups in the polyphenol compound have a structure expressed by the following chemical formula (1) or (2):

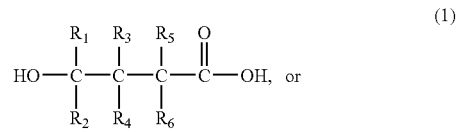

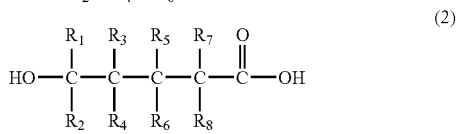

wherein $R_1$, $R_2$, $R_3$, $R_4$, $R_5$, $R_6$, $R_7$, and $R_8$ are hydrogen or alkyl groups each having 1 to 10 carbon atoms, and any one of the $R_1$, $R_2$, $R_3$, $R_4$, $R_5$, $R_6$, $R_7$, and $R_8$ is ether-linked to the phenolic hydroxyl group.

5. The photoresist compound according to claim 1, wherein
the molecule is a polyphenol compound having 3 to 12 phenol nuclei; and
the functional groups that are chemically converted due to an action of an acid with the reduced solubility in alkaline developer are linked to one of the phenolic hydroxyl groups contained in the polyphenol compound.

6. The photoresist compound according to claim 1, wherein
the polyphenol compound has a structure in which two or more triphenylmethane structures are coupled, by a nonconjugate bond, to a portion other than the functional groups that are chemically converted due to an action of an acid with the reduced solubility in alkaline developer.

7. The photoresist compound according to claim 1, wherein the polyphenol compound is at least one compound selected from the group consisting of compounds expressed by the following chemical formula (3):

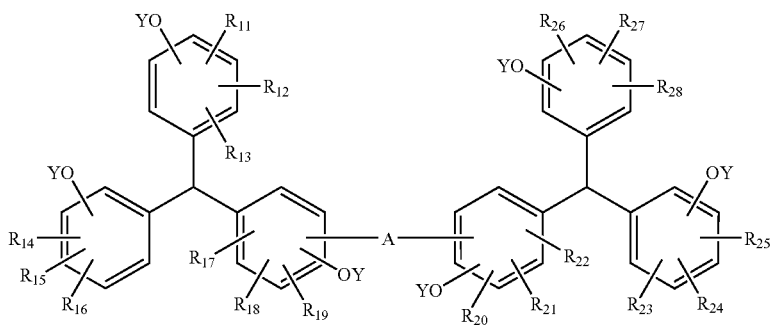

Wherein $R_{11}$ to $R_{28}$ are identical to or different from each other, and denote a hydrogen atom, a linear alkyl group, a branched alkyl group, a cyclic alkyl group, and an alkenyl group; The symbol A denotes a methylene group that may have a substituent group; and the symbols Y may be identical to or different from each other and denote any one of a hydrogen atom, an alkyl group, a γ-hydroxycarboxylic acid or a δ-hydroxycarboxylic acid.

8. The photoresist compound according to claim 1, wherein the polyphenol compound has an alkyl group having 1 to 10 carbon atoms at an ortho position of the phenolic hydroxyl group to which the functional group being chemically converted due to an action of an acid with the reduced solubility in alkaline developer is linked.

9. The photoresist compound according to claim 1, wherein the polyphenol compound is expressed by the following chemical formula (4):

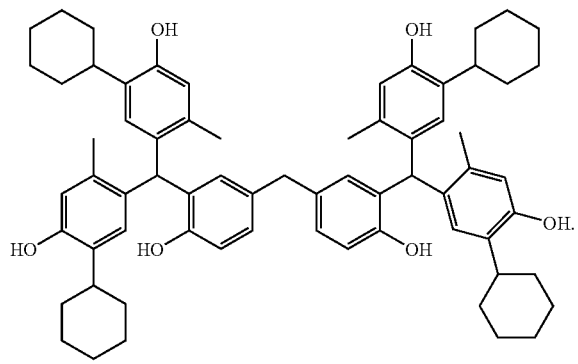

(4)

3M6C-MBSA

10. A negative-tone resist composition comprising the photoresist compound according to any one of claims 1 to 3 and 4 to 9 and a photo acid generator generating an acid when irradiated by a radioactive ray.

11. A method of forming a pattern comprising the steps of:

coating a substrate with the negative-tone resist composition according to claim 10, to obtain a resist layer;

irradiating the resist layer with a radioactive ray; and developing the resist layer irradiated by radioactive ray.

* * * * *